United States Patent [19]
Huang

[11] Patent Number: 6,095,361
[45] Date of Patent: Aug. 1, 2000

[54] CASE FRAME FOR A GAME MACHINE

[76] Inventor: Jammy Huang, No. 2-1, Alley 7, Lane 120, Ming-Sheng St., Hsiao-Kang Dist., Kaohsiung, Taiwan

[21] Appl. No.: 09/327,183

[22] Filed: Jun. 7, 1999

[51] Int. Cl.[7] ...................................................... B65D 7/00
[52] U.S. Cl. .................... 220/4.02; 220/4.33; 220/9.1; 220/9.4
[58] Field of Search .................................. 220/4.02, 4.33, 220/9.1, 9.4, 23.91

[56] References Cited

U.S. PATENT DOCUMENTS

| | | | |
|---|---|---|---|
| 2,941,710 | 6/1960 | Smith et al. | 220/9.1 |
| 5,065,890 | 11/1991 | Greenbaum | 220/9.1 |
| 5,335,805 | 8/1994 | Chen | 220/9.1 |
| 5,351,847 | 10/1994 | Greenbaum | 220/9.1 |
| 5,772,332 | 6/1998 | Geller | 220/9.1 |
| 5,808,866 | 9/1998 | Porter | 220/9.1 |

*Primary Examiner*—Joseph M. Moy
*Attorney, Agent, or Firm*—Bacon & Thomas

[57] ABSTRACT

A case frame of a game machine includes a top section, a middle section and a bottom section, wherein the middle section is connected between the top section and the bottom section. Each of the three section includes four vertical posts and each end of the vertical post has a three-way corner connector attached thereto. Four horizontal top side tubes and four horizontal bottom side tubes connected between the comer connectors on the respective ends of the vertical post so as to form a box frame. Panels are connected between the vertical posts and the horizontal top side tubes and the horizontal bottom side tubes. The top section, the middle section and the bottom section are connected by connecting plates. Thanks for the corner connectors, the case frame is easily assembled and disassembled.

5 Claims, 8 Drawing Sheets

CASE FRAME FOR A GAME MACHINE

FIELD OF THE INVENTION

The present invention relates to a case frame, and more particularly, to a case for a game machine and includes three parts each of which is assembled from tubes and various types of connectors.

BACKGROUND OF THE INVENTION

A conventional case for a game machine has a claw movably connected in the case in which dolls or other prizes are placed. A player inserts a coin to operate the claw to pick up a doll or prize and the doll picked up by the claw will be shifted to an outlet. The player then releases the claw to let the doll or prize drop into an access box so that the player can retrieve the doll or prize from outside of the access box. Generally, the three part case includes a top part that houses light fixtures, lights and the linkage to move the claw, a middle part that is essentially a basket or bin to hold the dolls or prizes, and a lower part that houses the actuator, cash box, a motor and other electric components. Each of the three parts is assembled from metal tubes that are connected by welding, rivets or screws. The parts assembled this way are difficult to disassemble and require a lot of time to assemble or reassemble.

The present invention intends to provide a case for a game machine wherein each part of the case is assembled by tubes and connectors so that the case is easily assembled and disassembled.

SUMMARY OF THE INVENTION

In accordance with one aspect of the present invention, a case frame for a game machine comprises a top section having four first vertical posts and each of the four first vertical posts having two three-way corner connectors respectively attached to each end. Four first horizontal bottom side tubes and four first horizontal top side tubes are connected between the three-way corner connectors on the respective ends of the four first vertical posts.

A middle section has four second vertical posts and three of the four second vertical posts have a three-way corner connectors attached to each end thereof. The other one second vertical post has a three-way corner connector attached to a top end thereof and a three-way in-line connector is attached to a lower end thereof. Four second horizontal bottom side tubes are connected between the four three-way corner connectors on the respective lower ends of the four second vertical posts. Another second post extends perpendicularly from one of the four second horizontal bottom side tubes and another three-way corner connector is connected to a top end of the another second post. A first C-shaped frame is connected between the three-way inline connector and the another three-way corner connector. A short tube is connected between the another three-way corner connector and one of the three-way corner connector on the second vertical post adjacent to the another second post. Three second horizontal top side tubes are connected between the three-way corner connectors on the three second vertical posts and the three-way in-line connector on the the other one second vertical post.

A bottom section has four third vertical posts, each end of the four third vertical posts having a three-way corner connector attached thereto. Four third horizontal bottom side tubes and four third horizontal top side tubes are connected between the three-way corner connectors on the respective ends of the four third vertical posts. Two second C-shaped frames are respectively connected to one of the third horizontal bottom side tubes and one of the third horizontal top side tubes. The top section, the middle section and the bottom section are connected to each other by a plurality of connecting plates.

The first horizontal bottom side tubes are connected to the second horizontal top side tubes by a plurality of connecting plates connects. The second horizontal bottom side tubes are connected to the third horizontal top side tubes by a plurality of the connecting plates.

The object of the present invention is to provide a case frame for a game machine wherein the case is easily assembled without using screws or rivets.

Further objects, advantages, and features of the present invention will become apparent from the following detailed description with appropriate reference to the accompanying drawings.

DETAILED DESCRIPTION OF THE PREFERRED EMBODIMENTS

Referring to FIGS. 1 to 4 and 7, the case frame for a game machine in accordance with the present invention comprises a top section (30), a middle section (20) and a bottom section (10). The top section (30) has four first vertical posts (32), and each of the four first vertical posts (32) has a three-way corner connectors (40) connected to each end. Each three-way corner connector (40) includes a vertical arm (400) and two horizontal arms (41) perpendicular to the vertical arm (400) and to each other such that the three arms (400, 41, 41) define the axes of three perpendicular planes. Four first horizontal bottom side tubes (31) and four first horizontal top side tubes (33) are connected between the three-way corner connectors (40) on the respective ends of the four first vertical posts (32). A side frame (300) is connected to a side of the top section (30).

Figure 1:
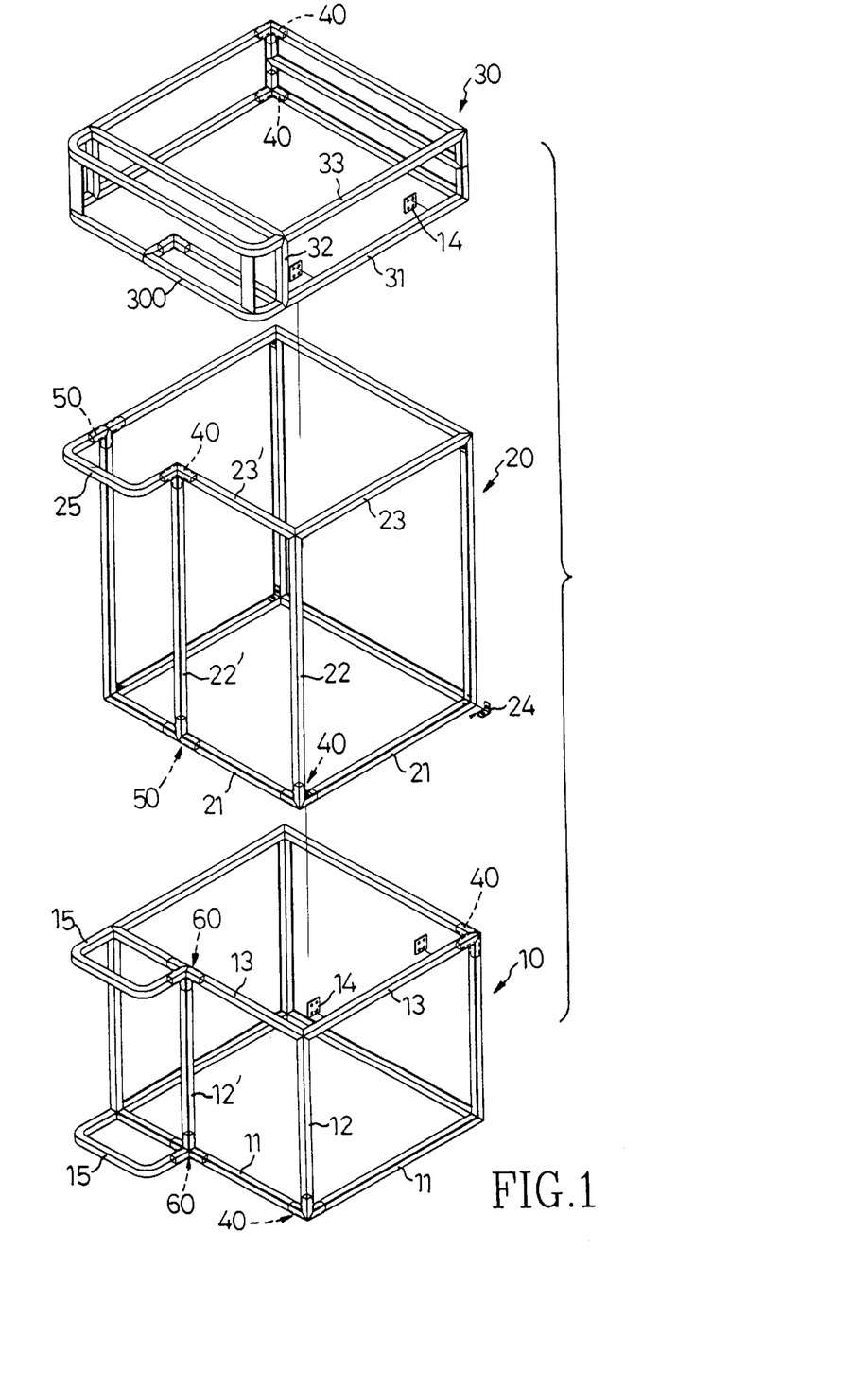
FIG. 1 is an exploded perspective view of the three sections of the case frame in accordance with the present invention.
Figures 2, 3:
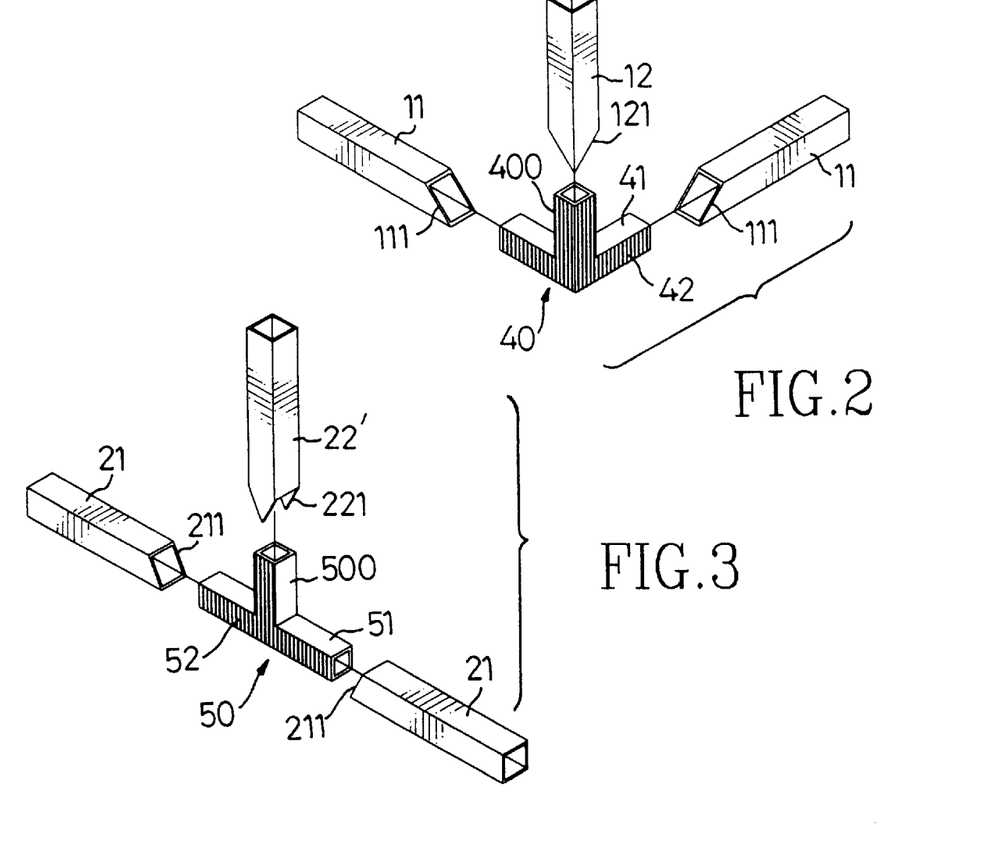
FIG. 2 is an exploded view of the three-way corner connector and the vertical post with two horizontal side tubes in accordance with the present invention.
FIG. 3 is an exploded perspective view of the three-way in-line connector and the vertical post with two horizontal side tubes in accordance with the present invention.

The middle section (20) has four second vertical posts (22) and three of the four second vertical posts (22) have a three-way corner connectors (40) attached to each end thereof. The other one second vertical post (22) has a three-way corner connector (40) attached to a top end thereof and a three-way in-line connector (50) is attached to a lower end thereof. Four second horizontal bottom side tubes (21) are connected between the four three-way corner connectors (40) on the respective lower ends of the four second vertical posts (22). Another second post (22') extends perpendicularly from one of the four second horizontal bottom side tubes (21)and another three-way corner connector (40) is connected to a top end of the another second post (22'). A first C-shaped frame (25) is connected between the three-way in-line connector (50) and the another three-way corner connector (40). A short tube (23') is connected between the another three-way corner connector (40) and one of the three-way corner connector (40) on the second vertical post (22) adjacent to the another second post (22'). The three-way in-line connector (50) has an vertical arm (500) with two horizontal arms (51) extending toward two opposite directions from the vertical arm (500). The another second post (22') is connected to the vertical arm (500) and two third side tubes (21) are respectively connected to the two horizontal arms (51). Three second horizontal top side tubes (23) are connected between the three-way corner connectors (40) on the three second vertical posts (22) and the three-way in-line connector (50) on the the other one second vertical post (22).

The bottom section (10) has four third vertical posts (12), each end of the four third vertical posts (12) having a three-way comer connector (40) attached thereto. Four third horizontal bottom side tubes (11) and four third horizontal top side tubes (13) are connected between the three-way corner connectors (40) on the respective ends of the four third vertical posts (12). Another third vertical post (12') is connected between one of the third horizontal top side tubes (13) and one of the third horizontal bottom side tubes (11). Two second C-shaped frames (15) are respectively connected to one of the third horizontal bottom side tubes (11) and one of the third horizontal top side tubes (13). The two second C-shaped frames (15) are respectively located between the another third vertical post (12') and the third vertical post (12) located beside the another third vertical post (12'). The first C-shaped frame (25) is located in alignment with the two second C-shaped frames (15).

Figure 4:
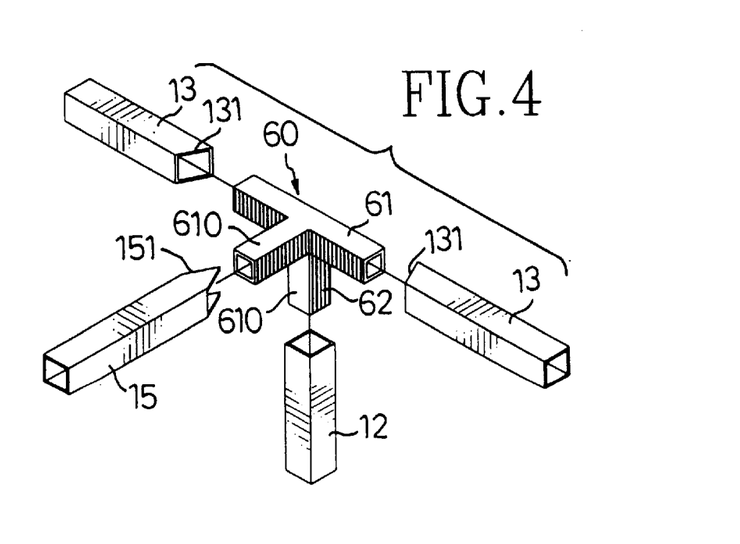
FIG. 4 is an exploded perspective view of the four-way corner connector and the vertical post with two horizontal side tubes and one end of a C-shaped frame member in accordance with the present invention.

Each of two ends of the another third vertical post (12') has a four-way comer connector (60) connected thereto, wherein the four-way corner connector (60) includes a bar (61) with two horizontal arms (610) respectively extending from the middle portion of the bar (61). The two horizontal arms (610) are perpendicular with each other and are perpendicularly to the bar (61). The third horizontal bottom side tube (11) and the third horizontal top side tube (13) connected to the another third vertical post (12') are respectively separated into two sections which are connected to the two ends of the bar (61) of the two four-way comer connector (60). The another third vertical post (12') and the second C-shaped frames (15) are respectively connected to the two horizontal arms (610).

The middle section (20) is connected to the top of the bottom section (10) by connecting plates (14) connecting the second horizontal bottom side tubes (21) to the third horizontal top side tubes (13). The top section (30) is connected to the top of the middle section (20) by connecting plates (14) connecting the second horizontal top side tubes (23) to the first horizontal bottom side tubes (31).

It is to be noted that each second vertical post (22) has two triangle lugs (22 1) extending longitudinally from each end of each second vertical post (22), and two ends of each second horizontal bottom side tube (21) are an inclined end which is matched with the two triangle lugs (221). Similarly, each third vertical post (12) has two triangle lugs (121) extending longitudinally from each end of each third vertical post (12), and two ends of each third horizontal bottom side tube (11) are an inclined end which is matched with the two triangle lugs (121). Each of the three-way comer connector (40), the three-way in-line connector (50) and the four-way comer connector (60) has a knurl surface (42, 52, 62) so as to provide a larger friction force between the tubes and the connectors.

Figure 5:
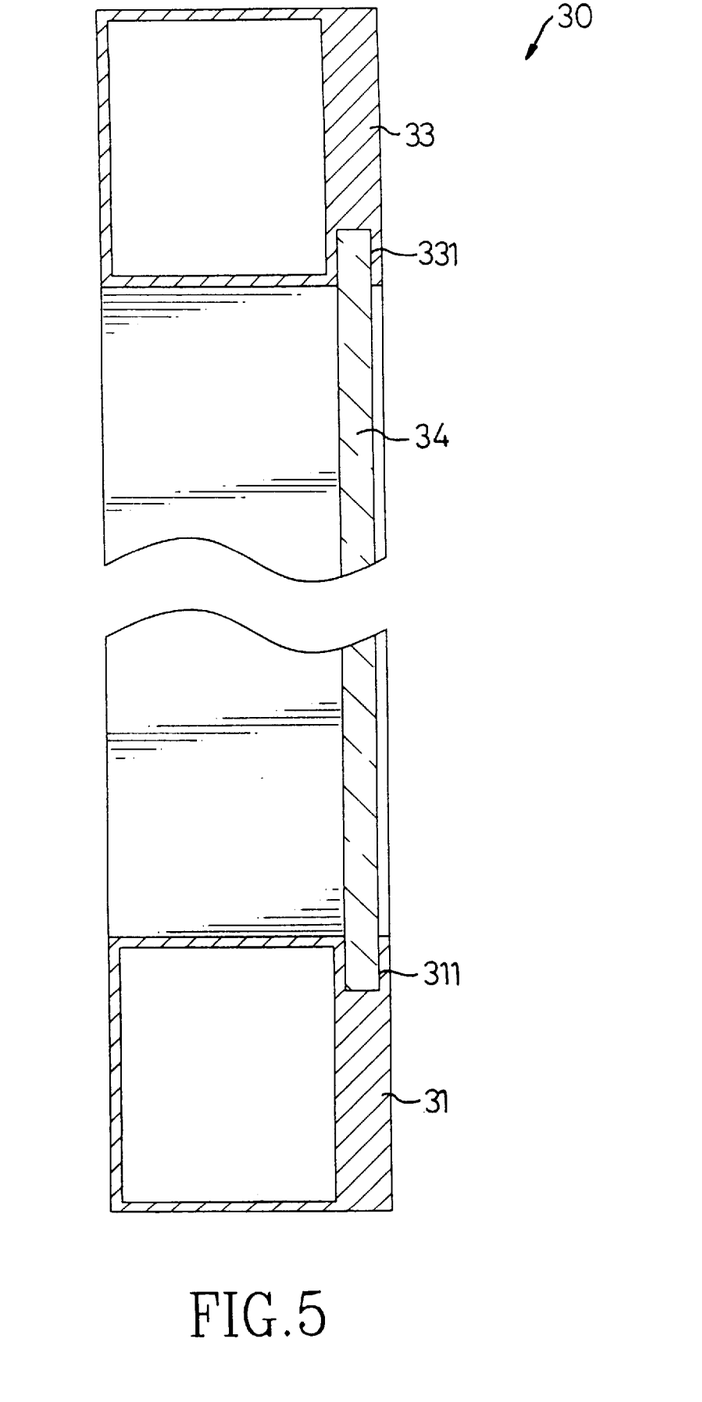
FIG. 5 is a side elevational view, partly in section, of a panel connected between the two side tubes in the top section in accordance with the present invention.
Figure 6:
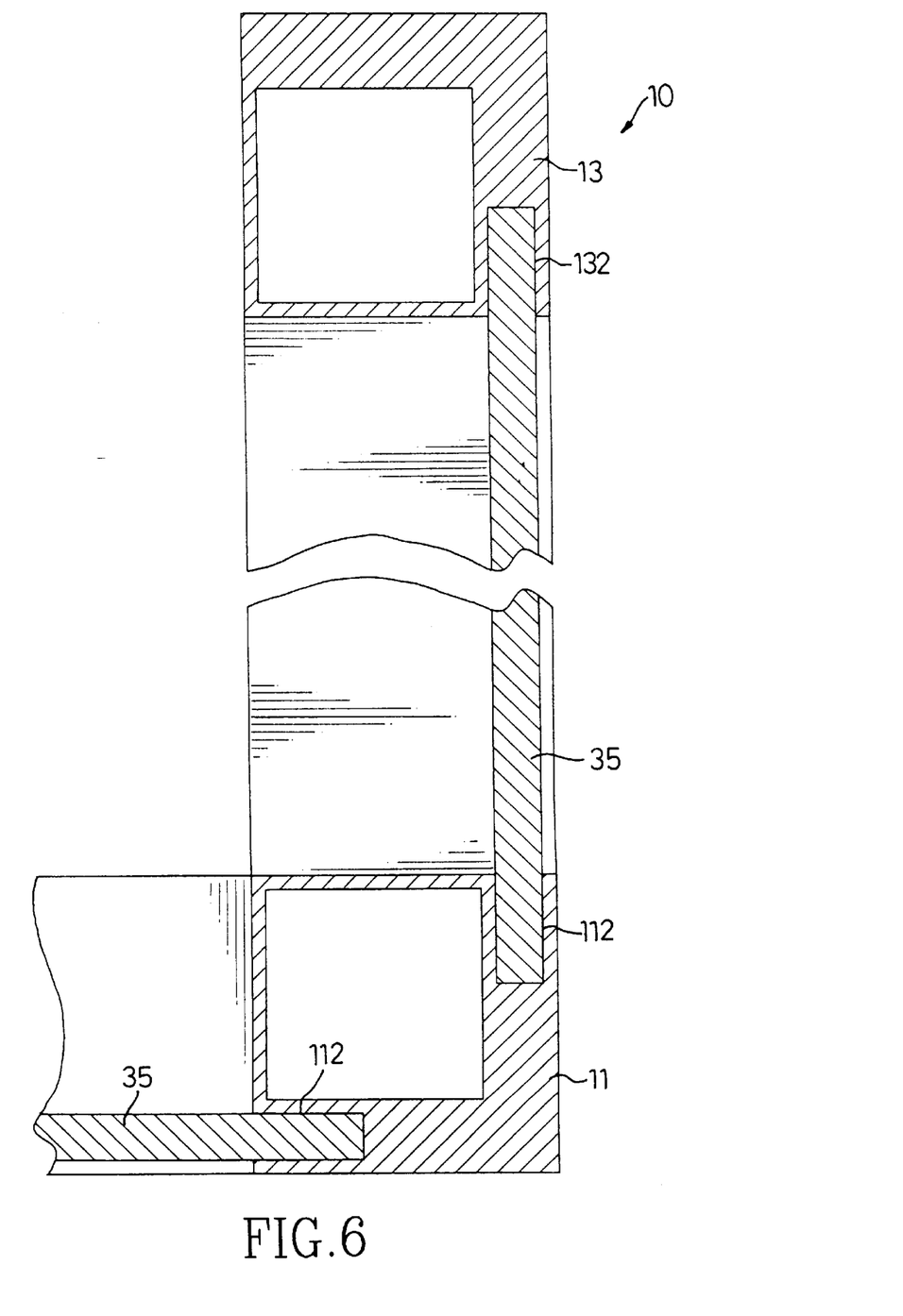
FIG. 6 is a side elevational view, partly in section, of a panel connected between the side tubes in the bottom section in accordance with the present invention.
Figure 7:
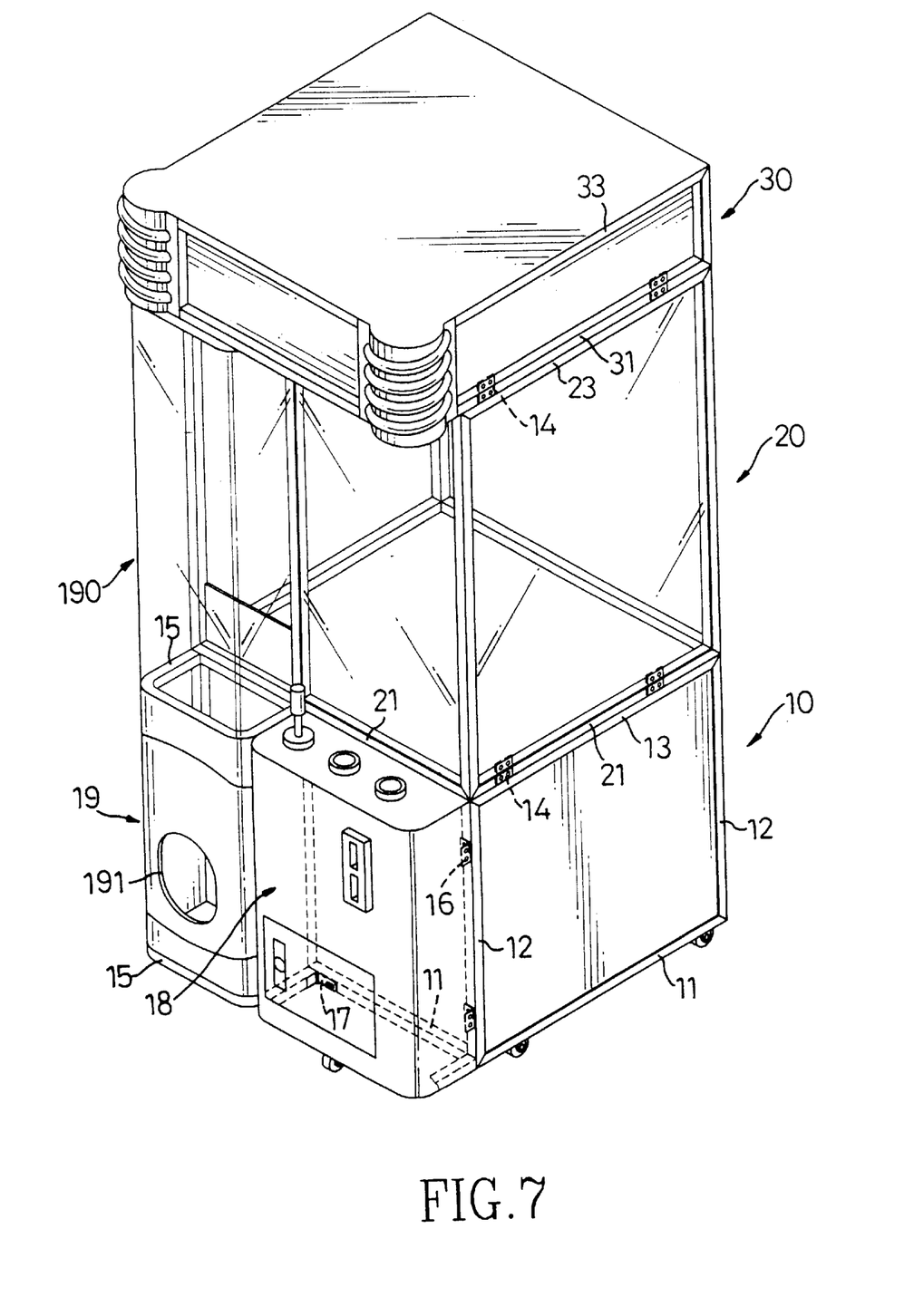
FIG. 7 is a perspective view of a doll-clawing game machine using the case frame in accordance with the present invention.

Referring to FIGS. 5 and 6, each first horizontal top side tube (33) and each first horizontal bottom side tubes (31) have a recess (331, 311) defined in a side thereof so that a panel (34) can be engaged between the two recesses (331, 311). Similarly, each third horizontal top side tube (13) and each third horizontal bottom side tube (11) have a recess (132, 112) defined therein so that a panel (35) can be engaged with the recesses (132, 112). By this way, the three sections (30, 20, 10) each have a closed outside. Referring to FIG. 7 again, a control box 18 is connected to the third section (10) by connecting plates (16, 17), a transparent frame (190) is connected between one of the second C-shaped frame (15) and the first C-shaped frame (25), and another box (19) is connected between the two C-shaped frames (15) wherein the box (19) has an access aperture (191) defined therethrough.

Figure 8:
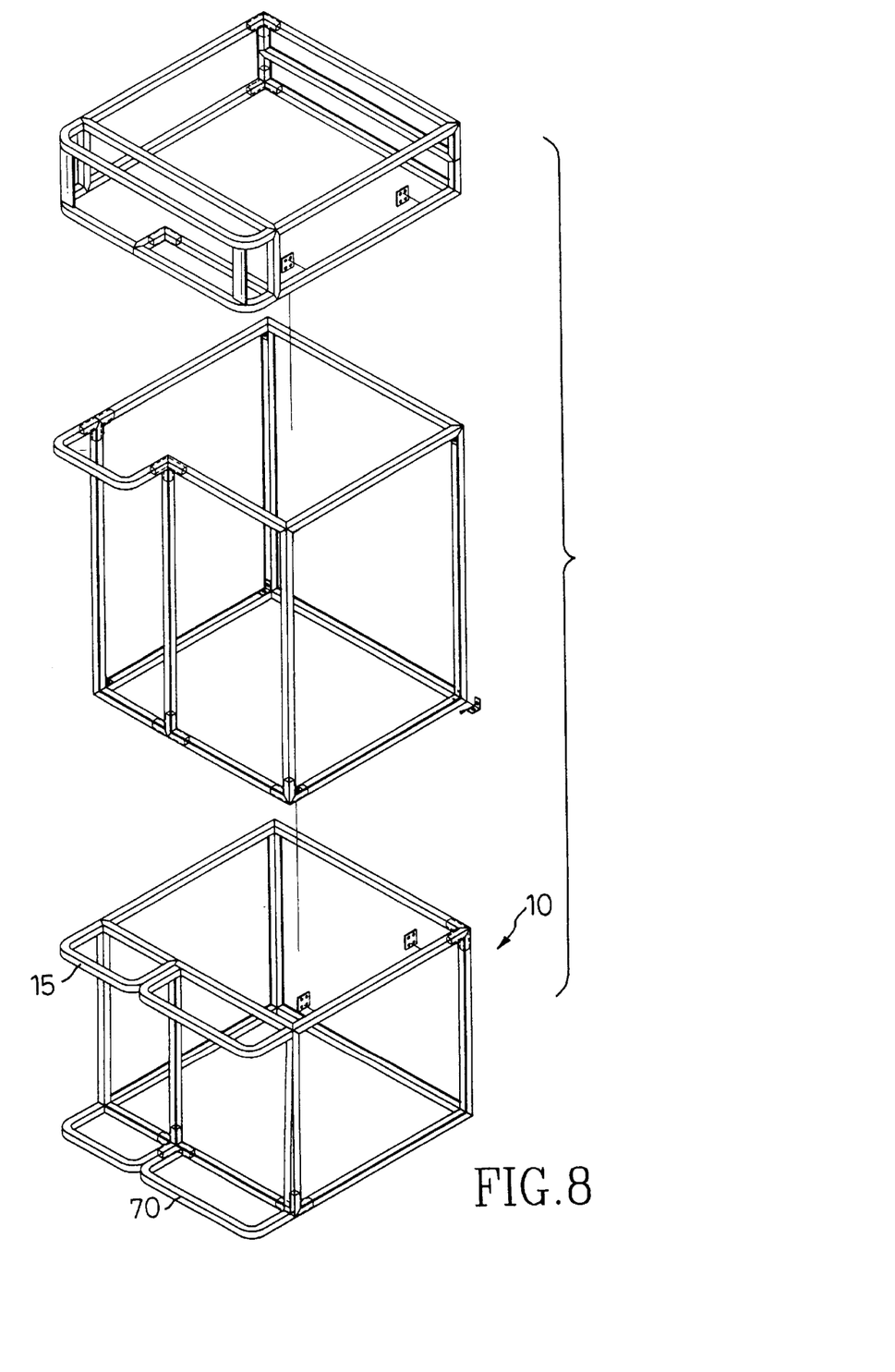
FIG. 8 is an exploded view of another embodiment of the three sections of the case frame in accordance with the present invention.
Figure 9:
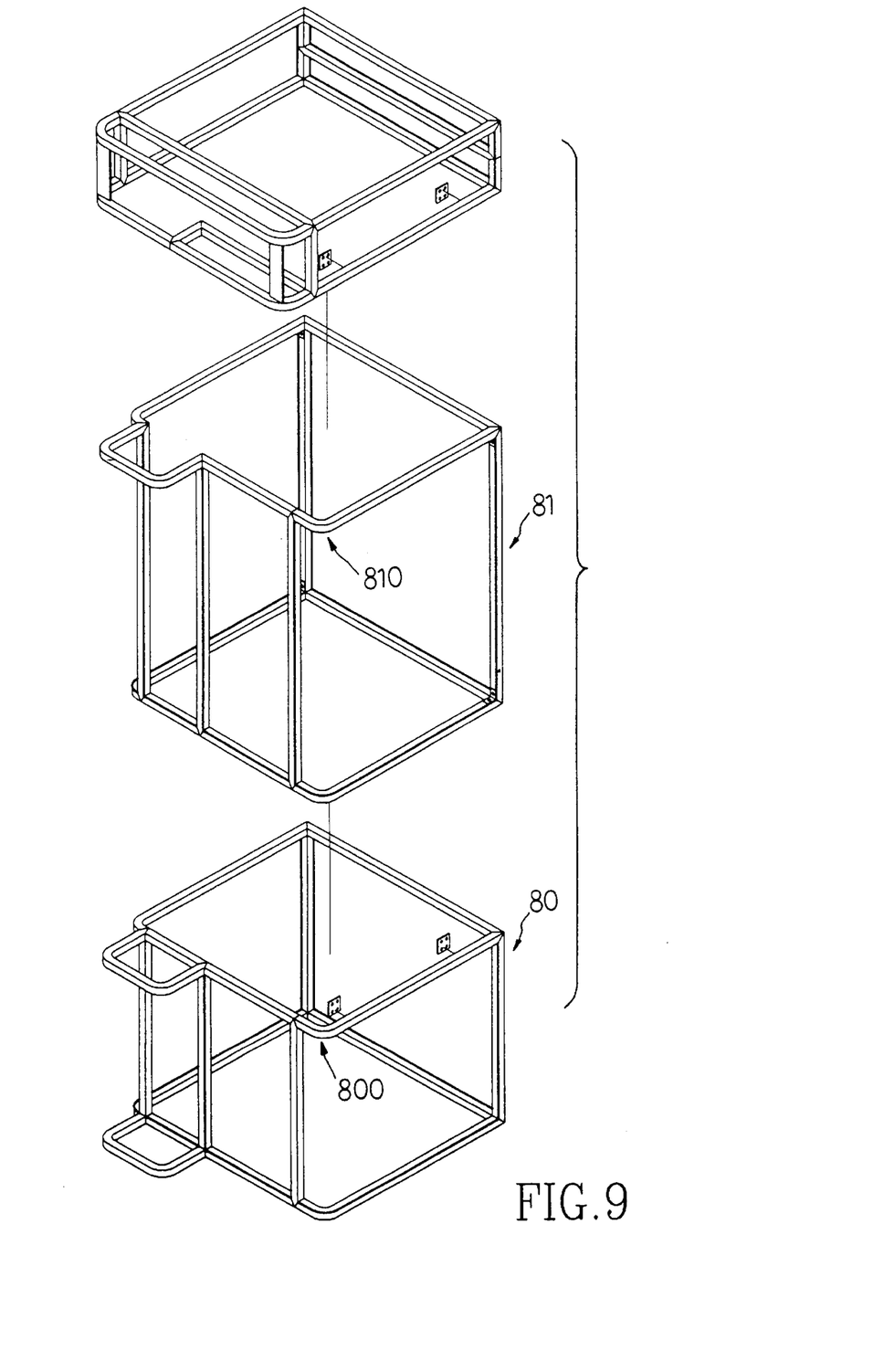
FIG. 9 is an exploded view of yet another embodiment of the three sections of the case frame in accordance with the present invention.
Figure 10:
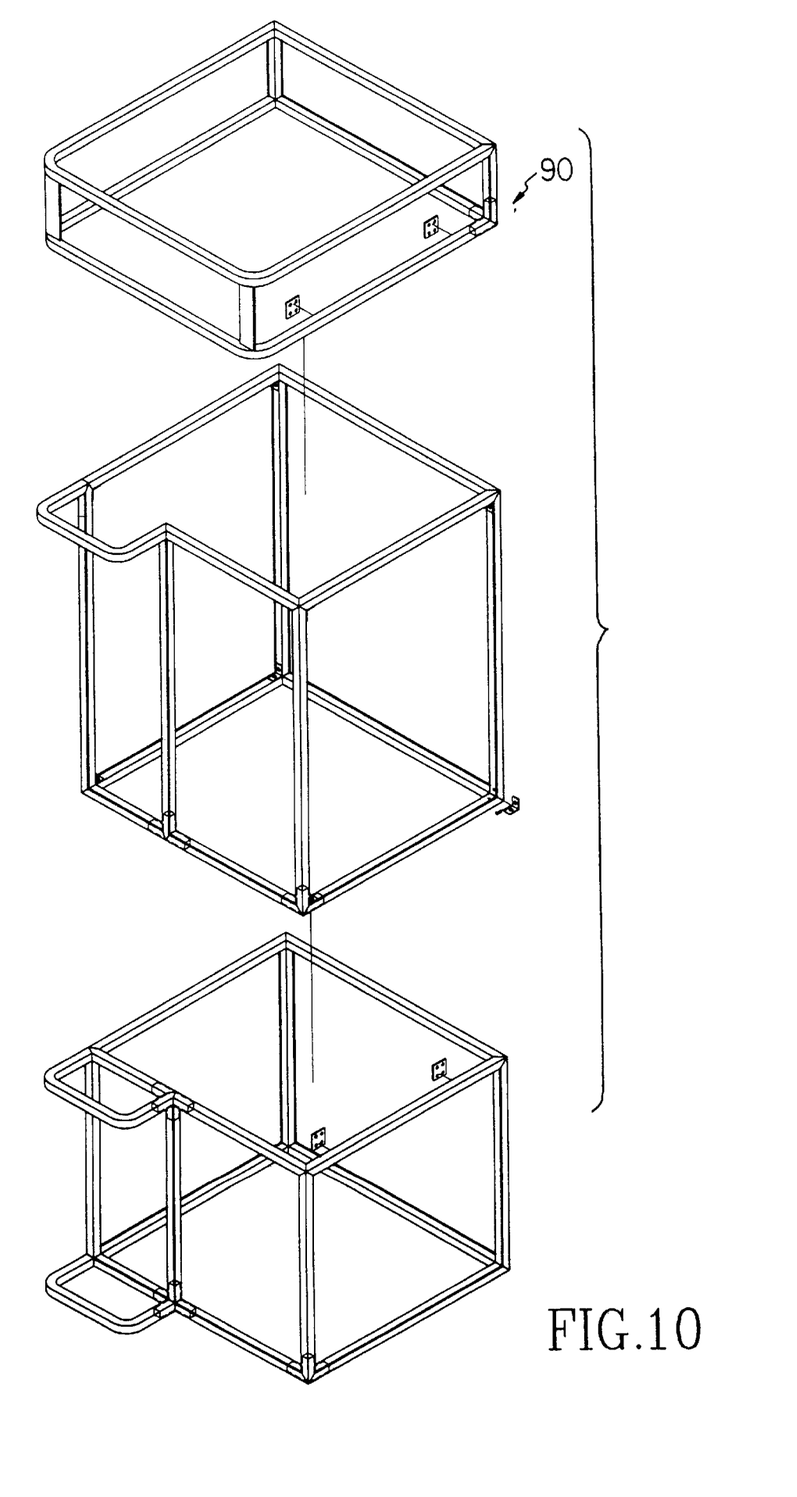
FIG. 10 is an exploded view of still yet another embodiment of the three sections of the case frame in accordance with the present invention.

FIG. 8 shows another embodiment of the present invention wherein two third C-shaped frames (70) are connected beside the two second C-shaped frames (15). FIG. 9 shows yet another embodiment of the present invention wherein the middle section (81) and the bottom section (80) each have a rounded comer (810/800). FIG. 10 shows yet another embodiment of the present invention wherein a new top section (90) is illustrated.

Although the invention has been explained in relation to its preferred embodiment, it is to be understood that many other possible modifications and variations can be made without departing from the spirit and scope of the invention as hereinafter claimed.

What is claimed is:

1. A case frame for a game machine, comprising:
a top section (30) having four first vertical posts (32) and each of said four first vertical posts (32) having two three-way comer connectors (40) respectively attached to each end, four first horizontal bottom side tubes (31) and four first horizontal top side tubes (33) connected between said three-way corner connectors (40) on the respective ends of said four first vertical posts (32);
a middle section (20) having four second vertical posts (22) and three of said four second vertical posts (22) having a three-way corner connectors (40) attached to each end thereof, the other one second vertical post (22) having a three-way comer connector (40) attached to a top end thereof and a three-way in-line connector (50) attached to a lower end thereof, four second horizontal bottom side tubes (21) connected between said four three-way comer connectors (40) on the respective lower ends of said four second vertical posts (22), another second post (22') extending perpendicularly from one of said four second horizontal bottom side tubes (21) and another three-way comer connector (40) connected to a top end of said another second post (22'), a first C-shaped frame (25) connected between said three-way in-line connector (50) and said another three-way comer connector (40), a short tube (23') connected between said another three-way comer connector (40) and one of said three-way comer connector (40) on said second vertical post (22) adjacent to said another second post (22'), three second horizontal top side tubes (23) connected between said three-way comer connectors (40) on said three second vertical posts (22) and said three-way in-line connector (50) on said the other one second vertical post (22);

a bottom section (10) having four third vertical posts (12), each end of said four third vertical posts (12) having a three-way comer connector (40) attached thereto, four third horizontal bottom side tubes (11) and four third horizontal top side tubes (13) connected between said three-way comer connectors (40) on the respective ends of said four third vertical posts (12), two second C-shaped frames (15) respectively connected to one of said third horizontal bottom side tubes (11) and one of said third horizontal top side tubes (13), and connecting plates (14) connected between said first horizontal bottom side tubes (31) and said second horizontal top side tubes (23), connecting plates (14) connected between said second horizontal bottom side tubes (21) and said third horizontal top side tubes (13).

2. The case as claimed in claim 1, wherein said first C-shaped frame (25) is located in alignment with said two second C-shaped frames (15).

3. The case as claimed in claim 1, wherein each second vertical post (22) has two triangle lugs (221) extending longitudinally from each end of each second vertical post (22), two ends of each second horizontal bottom side tube (21) being an inclined end which is matched with said two triangle lugs (221).

4. The case as claimed in claim 1, wherein each third vertical post (12) has two triangle lugs (121) extending longitudinally from each end of each third vertical post (12), two ends of each third horizontal bottom side tube (11) being an inclined end which is matched with said two triangle lugs (121).

5. The case as claimed in claim 1 further comprising another third vertical post (12') connected between one of said third horizontal top side tubes (13) and one of said third horizontal bottom side tubes (11).

* * * * *